June 12, 1956 N. E. LINDENBLAD 2,749,716

REFRIGERATION

Filed Nov. 19, 1954 2 Sheets-Sheet 1

INVENTOR.
Nils E. Lindenblad
BY Morris ? Rabin
ATTORNEY.

REFRIGERATION

Filed Nov. 19, 1954 2 Sheets-Sheet 2

INVENTOR.
Nils E. Lindenblad
BY Morris L. Rabkin
ATTORNEY.

2,749,716

REFRIGERATION

Nils E. Lindenblad, Princeton, N. J., assignor to Radio Corporation of America, a corporation of Delaware Application November 19, 1954, Serial No. 469,967

6 Claims. (Cl. 62—1)

This invention relates to refrigerating apparatus, and more particularly to apparatus for refrigerating by means of the Peltier effect.

When a direct current is passed through a circuit which couples two materials having dissimilar thermoelectric properties, one junction between the materials absorbs heat and the other junction releases heat. These circuits are called thermocouples. This phenomenon is called the Peltier effect. These thermocouples may be utilized to provide a thermoelectric refrigerator.

An object of this invention is to provide a structure for an efficient thermoelectric refrigerator.

Another object is to provide a structure for a thermoelectric refrigerator which inherently minimizes heat exchange with the ambient atmosphere.

A further object is to provide a compact structure for a dual compartment thermoelectric refrigerator.

A still further object is to provide an efficient structure for a thermoelectric refrigerator which is well adapted for quantity production.

A still further object is to provide a compact thermoelectric refrigerator which includes no mechanical moving parts.

In accordance with this invention thermocouple panels are assembled to form walls of an enclosure surrounding a storage chamber. The inner faces of the panels include cold junctions which absorb heat from this storage chamber. The outer faces of the panels release heat pumped through the panels. A fluid-tight casing surrounds the enclosure. A heat transfer fluid, tap water for example, circulates through this casing to absorb and carry away the heat released from the outer surfaces of the panels. The storage chamber is, therefore, effectively insulated from the ambient atmosphere.

The storage chamber may be partitioned to form two separate compartments. An additional thermocouple panel forms a wall of one of these compartments. The hot junction surface of this additional panel is disposed in heat exchange relationship with the inner cold junction surface of the enclosure panel. The enclosure panel, therefore, absorbs heat pumped through the additional panel. This additional panel, therefore, absorbs heat from its compartment at a relatively lower temperature. Its compartment may, therefore, serve as a low temperature or freezing compartment.

In one form of this invention, the low temperature compartment thermocouple panel may be vertically disposed. A heat transfer fluid may be contained within a substantially unobstructed space provided between the storage chamber wall and the cold junction surface of the enclosure panels. The fluid adjacent the hot junction surface of the low temperature compartment panel is relatively warmer than the fluid adjacent other walls of the enclosure. It, therefore, tends to rise and helps to circulate the fluid about this space. This promotes a circulation of cooler fluid from other portions of the space to help absorb heat from the low temperature compartment.

In another form of this invention, a pump may be provided to circulate the heat transfer fluid.

Other objects and advantages of the present invention will be apparent to one skilled in the art from a reading of the following specification in conjunction with the accompanying drawings in which.

Figure 1:
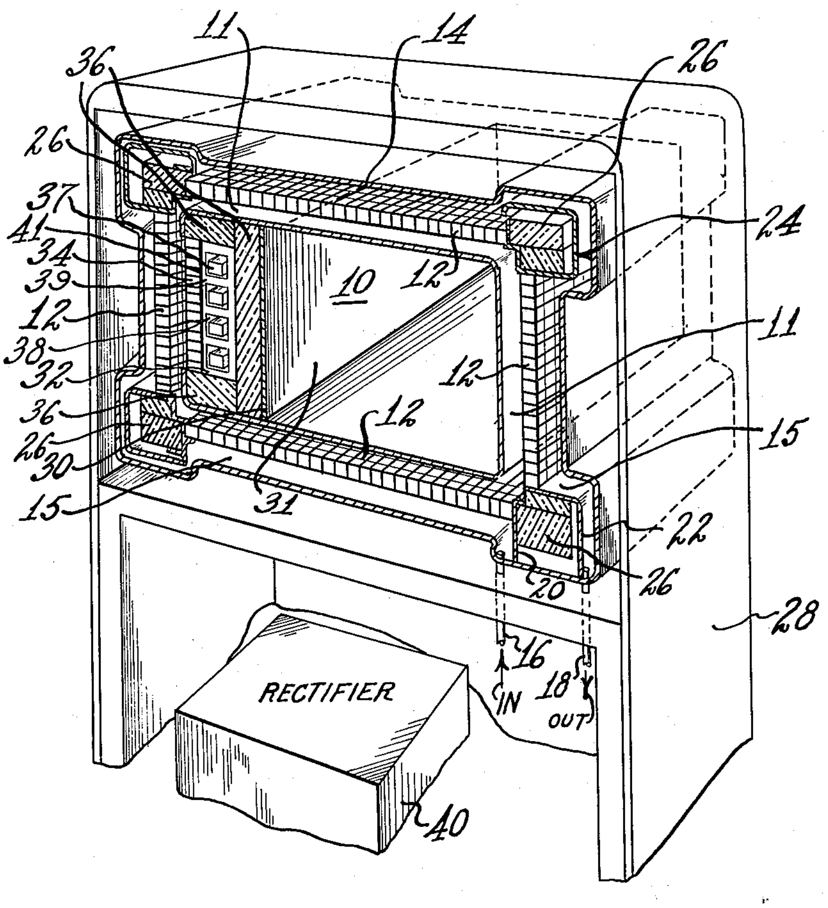
Fig. 1 is a perspective view in elevation and partially in cross section of an illustrative embodiment of this invention.

A pictorial representation of a refrigerator embodying features of this invention is shown in Fig. 1. The major portion of this refrigerator is shown in cross section to more clearly illustrate its structural features. The storage chamber 10 is surrounded by thermocouple panels 12. These thermocouple panels are shown surrounding the compartment on its sides and top and bottom. A thermocouple panel may also lie adjacent to the rear of the chamber 10. The front of the chamber is sealed by a door (not shown) to provide access to the chamber. The door may also include a thermoelectric panel if its additional heat absorbing capacity is desired. These thermocouple panels, therefore, form the walls of an enclosure surrounding the storage chamber either partially or completely.

The thermocouple panels, as is later explained in greater detail, have one surface or face adjacent the storage chamber. The other surfaces of the panels form the outer surfaces of the enclosure. The cold junctions of the thermocouple panels are, therefore, disposd on the inner surfaces of the enclosure walls, and the hot junctions of each of the thermocouples making up the panel are, therefore, disposed on the outside surfaces of the enclosure.

Means are provided for coupling the panels in heat exchange relationship with the storage chamber. This coupling means may, for example, be a heat transfer fluid filling the space 11 between the walls of the storage chamber 10 and the inner surface of the thermocouple panels. This heat transfer liquid or fluid must have a high electrical resistivity to prevent it from short circuiting the electrical circuit of the panel. A dielectric fluid, for example, transformer oil or kerosene, may be used. Any fluid or liquid having the high resistivity and good heat transfer properties is suitable for use.

The outside surface of the thermocouple panel enclosure is encased by a fluid-tight casing 14. This casing is spaced from the walls of the enclosure. A space 15 is provided for circulation of another heat transfer fluid. The fluid is admitted to this space through an inlet pipe 16. This fluid flows completely around the outer surface of the enclosure. It is discharged from the space 15 through an outlet pipe 18. The inlet and outlet are segregated from each other by partitions 20 and 22.

Adjacent sides of the thermocouple panels making up the enclosure are joined to each other by corner structures 24. These corner structures may be formed of an outer layer of sheet metal surrounding a core 26 of insulating material. The sheet material may be, for example, sheet aluminum. The insulating material may be, for example, asbestos or glass wool. The fluid-tight casing may be, for example, also sheet aluminum to provide a light weight unit. The fluid-tight casing is spaced from the corner structures as well as the panels to provide a continuous space 15 extending completely around the enclosure. A heat transfer fluid, for example, tap water may be, therefore, circulated from the inlet completely around the enclosure and discharged from the outlet. This fluid absorbs heat released from the hot junction surface of the panel and carries it away.

The fluid-tight casing including the structure within, is mounted in an ornamental case 28. The cooling fluid flowing through space 15 helps to isolate the structure from the surrounding atmosphere. Any suitable means (not shown) may be used to mount the fluid-tight casing within the ornamental casing. The ornamental casing may be formed, for example, of sheet steel which is coated with porcelain.

Food substances may be stored within chamber 10. A partition 30 divides the chamber into compartments 31 and 32. The larger compartment 31 is maintained at a temperature above freezing. It, therefore, corresponds to the main storage compartment of the ordinary household refrigerator. Food substances, for example, milk, cheese or butter may be stored therein without spoilage.

An additional thermocouple panel 34 forms an outer wall of the smaller compartment 32. This panel 34 is of the type similar to panels 12, later to be described in detail, having hot junctions in one surface and cold junctions in the other. The hot junction surface of this additional panel 34 is disposed adjacent the inside or cold junction surface of the adjacent thermocouple panel 12. The two thermocouple panels are maintained in heat exchange relationship by the heat conducting fluid within the space 11. The cold junctions of the enclosure thermocouple panel 12 absorb heat from the hot junctions of the additional thermocouple panel 34. The other walls of compartment 32 are insulated from the space 11 and from the main portion 31 of the storage compartment by layers 36 of insulating material, for example, asbestos or glass wool. Since the hot junctions of thermocouple panel 34 are cooled by heat absorbed at the inner cold junction surface of the enclosure panels 12, the panel 34 absorbs heat from the segregated compartment 32 at a lower temperature than the enclosure panels absorb heat from the main portion 31 of the storage chamber 10. The segregated compartment 32 is, therefore, maintained at a lower temperature than the main storage compartment 31.

Compartment 32 may, therefore, be maintained at a temperature below freezing. Trays 37 are mounted in drawers 38 in a freezing block 39 which may be, for example, aluminum, which is electrically insulated from the panel 34 by an electrically insulating and thermally conducting skin 41, for example, of rubber. This freezing block 39 occupies all of the free space within compartment 32. Food substances to be frozen may be placed in these trays. Compartment 32, therefore, corresponds to the freezing compartment of the ordinary refrigerator. Ice may also be formed in this freezing compartment 32.

The heat transfer fluid in the space 11 between the heat conducting wall of storage compartment 10 and the inner surface of the enclosure panels 12 provides a means for transferring heat from the main portion of the storage chamber 10 to the heat absorbing junctions on the inner surfaces of the enclosure panel. The fluid adjacent the additional panel 34 transfers more heat than the fluid adjacent the wall of the main compartment 31. This fluid adjacent the panel 34, therefore, becomes warmer than the fluid in other portions of the space 11 because more heat is added at this point. The additional panel 34 is disposed in a vertical portion of the space so that the fluid warmed between the panels 12 and 34 can form a rising current. This current helps circulate the warmer fluid to other portions of the space where it equalizes in temperature with the remaining fluid. This current also provides a circulation of heat transfer fluid of relatively cooler temperature from other portions of space 11 to the portion of the space between the enclosure panel 12 and the additional panel 34. This prevents the fluid between the panels 12 and 34 from becoming excessively warm and interfering with heat transfer. This circulation of fluid also distributes the added heat-absorbing work associated with the freezing compartment to all of the enclosure panels. If desirable for certain uses of the invention, a pump or the like may be employed to assist flow of the fluid.

A rectifier 40 is shown concealed in the base of the unit. This rectifier is used to supply direct current for the thermocouple panels from a domestic wiring circuit providing alternating-current. Where direct-current is available, the rectifier may be dispensed with. The cooling fluid circulating in space 15 within the fluid-tight casing 14 prevents rectifier heat from being transmitted to the storage chamber. This helps maintain the thermal efficiency of this structure.

Figure 2:
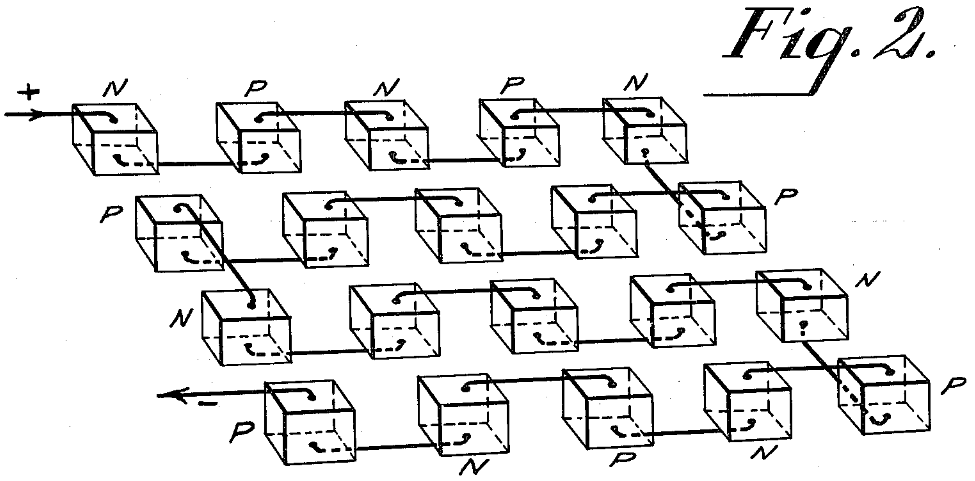
Fig. 2 is a perspective schematic diagram showing the electrical circuit of a thermocouple panel utilized in this same embodiment.

In Fig. 2 a perspective electrical schematic diagram of a thermocouple panel, such as the panel 12 or 34, is shown. The alternate cubes in the Fig. 2 represent materials having dissimilar thermoelectric properties. The alternate cubes in horizontal rows are, for example, of different materials. The cubes are labeled N and P to indicate their thermoelectric characteristics. The cubes labeled N are of materials having an abundance of electrons. The cubes labeled P are of materials having an abundance of electron vacancies or holes. Antimony may be used, for example, as P type material; and bismuth may be used, for example, as N type material. This "N" and "P" nomenclature is prevalent in semi-conductor terminology today and is found to be convenient in differentiating the materials havig dissimilar thermoelectric properties which form thermocouples. A thermocouple is formed of an N type material coupled to a P type material. When a current is run in the direction from N to P, the junction between the N and P type becomes cold. When the current is run from P to N, the junction between the P and N type becomes hot.

The cubes of N and P type material are connected here in a manner to provide N to P cold junctions at the bottom of the panel and P to N hot junctions adjacent the upper surface of the panel. The lower surface of the panel, therefore, absorbs heat while the upper surface releases heat. The panel shown in Fig. 2 has all of its cubes connected in series for convenience of power supply. They, therefore, carry the same current thereby providing uniform heat pumping throughout the panel. Other circuit arrangements providing cold junctions adjacent one surface of the panel and hot junctions adjacent the other surface of the panel may be utilized.

Figure 3:
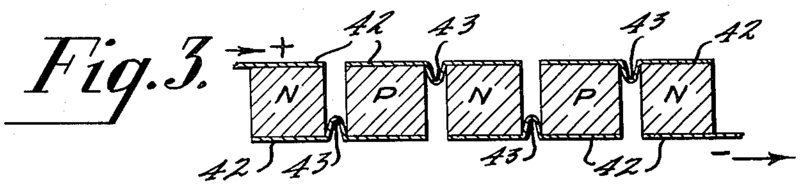
Fig. 3 is a cross-sectional view in elevation showing characteristics of illustrative electrical connectors which may be utilized in thermocouple panels.

In Fig. 3 are shown some of the connectors between adjacent N and P type materials in a thermocouple panel 12 or 34. The connections are made by straps 42 bound to adjacent N and P type alloys. These straps are formed with an indentation or kink 43 between the materials they connect. The materials may be brittle and, therefore, must not be subjected to physical stress by the structural or electrical connections. The connectors 42 are accordingly formed of conducting spring material, for example, bronze or copper. These straps 42 should also have good heat conducting properties so as not to interfere with heat being pumped through the panel.

Figure 4:
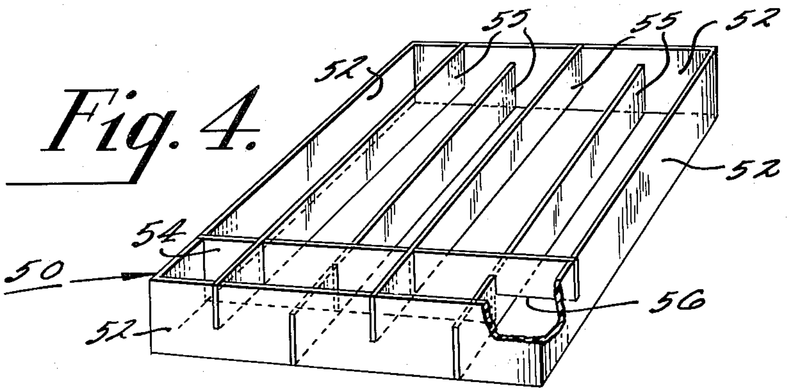
Fig. 4 is a perspective view of a structural portion of an illustrative thermocouple panel.
Figure 5:
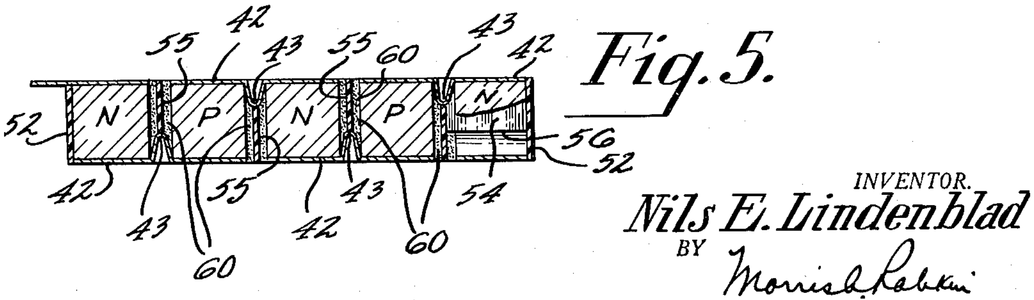
Fig. 5 is a cross-sectional view in elevation of a portion of an illustrative thermocouple panel.

Fig. 4 shows certain parts of the structural portions of a panel 50. It includes an outer framework or sides 52 subdivided into compartments by a network of strips 54 and 55. The strips cross each other at right angles to provide compartments or pigeon holes similar to those in an egg carton. The framework and strips are formed of electrically and thermally insulating material, for example, Micarta or Bakelite, to prevent short circuiting the thermocouples and to prevent heat from being dissipated through sides of the panel. Strips 55 are not made equal to the full height of the sides 52 of the panel. One strip 55 is inserted in a notch in the side 52 extending down from the top of side 52 while the next strip 55 is inserted within a notch extending up from the bottom of side 52. Upper portions of one adjacent pair of N and P type alloys are, therefore, unobstructed for connection by a strap 42, as shown in Fig. 5, while the lower surfaces of the next adjacent pair of N and P type alloys are unobstructed for electrical connection across their lower surfaces. The electrical connections to provide the series circuit may, therefore, be made with facility by use of one type of electrical connector. The end portion of a strip 54 is cut away at 56 to allow electrical connections to be made from one row of materials to the adjacent row by a strap 42. The spaces between the materials are sealed by a cement 60, such as shellac, for example. This cement binds the materials to the structure and makes the panels water tight.

What is claimed is:

1. A refrigerator including thermocouple panels having cold junctions and hot junctions on opposite surfaces thereof, said panels being disposed to form the walls of an enclosure, a storage chamber disposed within said walls, said panels having their cold junctions disposed in heat exchange relationship with said storage chamber to absorb heat from said chamber, said panels having their hot junctions disposed upon the external surfaces of said enclosure to release heat from said enclosure, a fluid-tight casing disposed about said panels to provide a space surrounding said enclosure, and means for circulating a heat transfer fluid within said space to absorb and to carry said released heat away from said enclosure.

2. A refrigerator including thermocouple panels having cold junctions and hot junctions on opposite surfaces thereof, said panels forming the walls of an enclosure, a storage chamber disposed within said walls, said panels having their cold junctions disposed in heat exchange relationship with said storage chamber to absorb heat from said chamber, a fluid-tight casing surrounding said enclosure, means for circulating a heat transfer fluid within said casing in heat exchange relationship with said hot junctions of said panels to absorb heat from said hot junctions, said storage chamber including a relatively lower temperature compartment, an additional thermocouple panel being disposed to form a heat-absorbing wall of said lower temperature compartment, and said additional panel having its hot junctions disposed in heat exchange relationship with said cold junctions of said panel forming a wall of said enclosure to absorb heat from said lower temperature compartment at a relatively lower temperature.

3. A refrigerator including thermocouple panels having cold junctions and hot junctions on opposite surfaces thereof, said panels forming the walls of an enclosure, a storage chamber disposed within said walls, said panels having their cold junctions disposed towards said storage chamber and disposed a distance from said chamber to provide a space between said chamber and said enclosure, said panels having their hot junctions disposed on the external surfaces of said enclosure to release heat from said enclosure, a fluid-tight casing being disposed about said panels to provide an externally disposed space surrounding said enclosure, means for circulating a heat transfer fluid within said externally disposed space in heat exchange relationship with said hot junctions of said panels to absorb and carry away heat from said hot junctions, said storage chamber including a relatively lower temperature compartment, an additional thermocouple panel being disposed to form a heat-absorbing wall of said lower temperature compartment and also to form a wall of said chamber, and a heat transfer fluid being disposed in the space between said chamber and said enclosure to carry heat from said chamber and its thermocouple wall to said cold junctions of said panels forming said enclosure.

4. A refrigerator including thermocouple panels having cold junctions and hot junctions on opposite surfaces thereof, said panels forming the walls of an enclosure, a storage chamber disposed within said walls, said panels having their cold junctions disposed towards said storage chamber and spaced from said chamber to provide a space between said chamber and said enclosure, said panels having their hot junctions disposed on the external surfaces of said enclosure to release heat from said enclosure, a fluid-tight casing being disposed about said panels to provide an externally disposed space surrounding said enclosure, means for circulating a heat transfer fluid within said externally disposed space in heat exchange relationship with said hot junctions of said panels to absorb heat from said hot junctions, said storage chamber including a relatively lower temperature compartment, an additional thermocouple panel being disposed to form a heat-absorbing wall of said lower temperature compartment and also to form a wall of said chamber, a heat transfer fluid being disposed in the space between said chamber and said enclosure to carry heat from said chamber and its thermocouple wall to said cold junctions of said panels forming said enclosure, and said thermocouple wall being vertically disposed to provide rising currents within said space between said chamber and said enclosure to promote circulation of said heat transfer fluid within said space.

5. A refrigerator including thermocouple panels having cold junctions and hot junctions on opposite surfaces thereof, said panels being disposed to form the walls of an enclosure, a storage chamber disposed within said walls, said panels having their cold junctions disposed in heat exchange relationship with said storage chamber to absorb heat from said chamber, said panels having their hot junctions disposed upon the external surfaces of said enclosure to release heat from said enclosure, a fluid-tight casing disposed about said panels to provide a space surrounding said enclosure, means for circulating a heat transfer fluid within said space to absorb and to carry said released heat away from said enclosure, said panels including materials having dissimilar thermoelectric properties, and electrically conducting straps binding adjacent materials in said panels, said straps being made of spring material and including a stress-absorbing kink to prevent forces from being transmitted to said materials.

6. A refrigerator including thermocouple panels having cold junctions and hot junctions on opposite surfaces thereof, said panels being disposed to form the walls of an enclosure, a storage chamber disposed within said walls, said panels having their cold junctions disposed in heat exchange relationship with said storage chamber to absorb heat from said chamber, said panels having their hot junctions disposed upon the external surfaces of said enclosure to release heat from said enclosure, a fluid-tight casing disposed about said panels to provide a space surrounding said enclosure, means for circulating a heat transfer fluid within said space to absorb and to carry said released heat away from said enclosure, said panels having a structure formed to provide pigeon holes for materials having dissimilar thermoelectric properties, said materials being disposed within said pigeon holes, means for electrically connecting said materials to pump heat through said panels, and a sealing substance disposed between said materials and said structure to make said panels water tight.

References Cited in the file of this patent

UNITED STATES PATENTS

| | | |
|---|---|---|
| 1,120,781 | Altenkirch et al. | Dec. 15, 1914 |
| 1,818,437 | Stuart | Aug. 11, 1931 |
| 2,635,431 | Bichowsky | Apr. 21, 1953 |

FOREIGN PATENTS

| | | |
|---|---|---|
| 4,141 | Australia | Oct. 7, 1926 |
| 700,013 | France | Dec. 17, 1930 |